United States Patent
Myrah et al.

(10) Patent No.: US 10,342,162 B2
(45) Date of Patent: Jul. 2, 2019

(54) DATA CENTER PRESSURE ANOMALY DETECTION AND REMEDIATION

(71) Applicant: Microsoft Corporation, Redmond, WA (US)

(72) Inventors: Michael G. Myrah, Sammamish, WA (US); Matthew J. Eason, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 740 days.

(21) Appl. No.: 14/524,096

(22) Filed: Oct. 27, 2014

(65) Prior Publication Data
US 2016/0120070 A1    Apr. 28, 2016

(51) Int. Cl.
G05D 23/00    (2006.01)
H05K 7/20    (2006.01)
(Continued)

(52) U.S. Cl.
CPC ......... H05K 7/20745 (2013.01); F04D 15/00 (2013.01); G05B 15/02 (2013.01); H05K 7/20836 (2013.01); Y02B 30/00 (2013.01)

(58) Field of Classification Search
CPC ...... B08B 15/023; G05B 13/02; G01R 27/00; H05K 7/20; H05K 7/20209;
(Continued)

(56) References Cited

U.S. PATENT DOCUMENTS 4,706,553 A * 11/1987 Sharp ................ B08B 15/023
454/61
8,456,840 B1    6/2013 Clidaras et al.
(Continued)

FOREIGN PATENT DOCUMENTS

CN    102144198 A    8/2011
CN    102625643 A    8/2012
(Continued)

OTHER PUBLICATIONS

Kumar, et al., "Effect of Server Load Variation on Rack Air Flow Distribution in a Raised Floor Data Center", In 27th Annual IEEE Semiconductor Thermal Measurement and Management Symposium, Mar. 20, 2011, pp. 90-96.
(Continued)

Primary Examiner — Tuan A Vu
(74) Attorney, Agent, or Firm — Fiala & Weaver P.L.L.C.

(57) ABSTRACT

A system is described that can detect pressure anomalies within a data center, generate an alert when anomalies are detected, and initiate remediative actions. The system monitors each of a plurality of fans used to dissipate heat generated by one or more servers to obtain data that indicates how an actual speed of each of the fans relates to a target speed thereof. The system compares the obtained data to reference data that indicates, for each of the plurality of fans, how an actual speed of the fan relates to a target speed thereof in a substantially pressure-neutral environment. Based on the comparison, the system determines whether or not a pressure anomaly exists. If the system determines that a pressure anomaly exists, then the system may perform various actions such as generating an alert and modifying a manner of operation of one or more of the fans or servers.

20 Claims, 8 Drawing Sheets

(51) Int. Cl.
*G05B 15/02* (2006.01)
*F04D 15/00* (2006.01)

(58) Field of Classification Search
CPC ............ H05K 7/20836; H05K 7/20745; F28D 20/00; F28D 5/00; F24F 11/086; G05D 23/1919; Y02B 30/00
See application file for complete search history.

(56) References Cited

U.S. PATENT DOCUMENTS

| | | | |
|---|---|---|---|
| 8,467,906 B2 | 6/2013 | Michael et al. | |
| 8,600,560 B2 | 12/2013 | Smith et al. | |
| 2003/0218465 A1* | 11/2003 | Rijken | H05K 7/20209 324/537 |
| 2006/0142901 A1 | 6/2006 | Frankel et al. | |
| 2008/0245083 A1* | 10/2008 | Tutunoglu | F24F 11/0086 62/115 |
| 2009/0061756 A1* | 3/2009 | Germagian | H05K 7/20836 454/184 |
| 2009/0301123 A1* | 12/2009 | Monk | F24F 11/0001 62/259.2 |
| 2009/0327778 A1* | 12/2009 | Shiga | G05D 23/1919 713/320 |
| 2011/0195652 A1 | 8/2011 | Smith | |
| 2011/0239025 A1* | 9/2011 | Artman | H05K 7/20836 713/323 |
| 2012/0257348 A1 | 10/2012 | Chang | |
| 2013/0048266 A1 | 2/2013 | Bauchot et al. | |
| 2013/0062047 A1* | 3/2013 | Vaney | H05K 7/20836 165/287 |
| 2013/0265064 A1* | 10/2013 | Hamann et al. | G01R 27/00 324/700 |
| 2014/0014292 A1 | 1/2014 | Rice et al. | |
| 2014/0031956 A1* | 1/2014 | Slessman | G05B 13/02 700/28 |
| 2014/0092549 A1 | 4/2014 | Kodama | |
| 2014/0298839 A1* | 10/2014 | Nagamatsu et al. | H05K 7/20 62/186 |
| 2015/0096714 A1* | 4/2015 | Dagley et al. | F28D 20/00 165/8 |
| 2015/0153109 A1* | 6/2015 | Reytblat et al. | F28D 5/00 62/259.4 |

FOREIGN PATENT DOCUMENTS

| | | |
|---|---|---|
| CN | 202679885 U | 1/2013 |
| CN | 103931278 A | 7/2014 |
| WO | 2010027355 A1 | 3/2010 |
| WO | 2013016845 A1 | 2/2013 |

OTHER PUBLICATIONS

"International Search Report & Written Opinion Issued in PCT Application No. PCT/US2015/057271", dated Feb. 4, 2016, 14 Pages.

"International Preliminary Report on Patentability Issued in PCT Patent Application No. PCT/US2015/057271", dated Jan. 25, 2017, 9 Pages.

"Second Written Opinion Issued in PCT Application No. PCT/US2015/057271", dated Sep. 22, 2016, 6 Pages.

"First Office Action Issued in Chinese Patent Application No. 201580058819.6", dated Oct. 22, 2018, 24 Pages.

* cited by examiner

DATA CENTER PRESSURE ANOMALY DETECTION AND REMEDIATION

BACKGROUND

In data centers that utilize hot aisle containment units for environmental control, macroscopic pressure issues occasionally arise. For example, if the fans that operate to cool a group of servers cause air to be blown into a hot aisle containment unit at a rate that exceeds the rate at which air can be removed therefrom, then the hot aisle containment unit will become pressured relative to adjacent cold aisle(s). As the pressure increases, the hot air in the hot aisle containment unit can push out of containment panels and other openings into the cold aisle(s) and be drawn into nearby servers. These servers can exceed their specified thermal values and trip thermal alarms or possibly become damaged due to excessive heat. Excessive pressure in the hot aisle containment unit can also cause other environmental control components to be damaged. For example, exhaust fans that are used to draw hot air out of the hot aisle containment unit could potentially be damaged by the excessive pressure.

SUMMARY

A system is described herein that is operable to automatically detect pressure anomalies within a data center, to generate an alert when such anomalies are detected, and to initiate actions to remediate the anomalies. In accordance with embodiments, the system monitors each of a plurality of fans used to dissipate heat generated by one or more servers in the data center. The fans may comprise, for example, server fans or blade chassis fans that blow air into a hot aisle containment unit. Through such monitoring, the system obtains data that indicates how an actual speed of each of the fans relates to a target speed of each of the fans. The system then compares the obtained data to reference data that indicates, for each of the plurality of fans, how an actual speed of the fan relates to a target speed of the fan in a substantially pressure-neutral environment. Based on the comparison, the system determines whether or not a pressure anomaly exists in the data center. If the system determines that a pressure anomaly exists in the data center, then the system may generate an alert and/or take steps to remediate the anomaly. Such steps may include, for example, modifying a manner of operation of one or more of the fans and/or modifying a manner of operation of one or more of the servers.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the claimed subject matter is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the relevant art(s) to make and use the invention.

Figure 1:
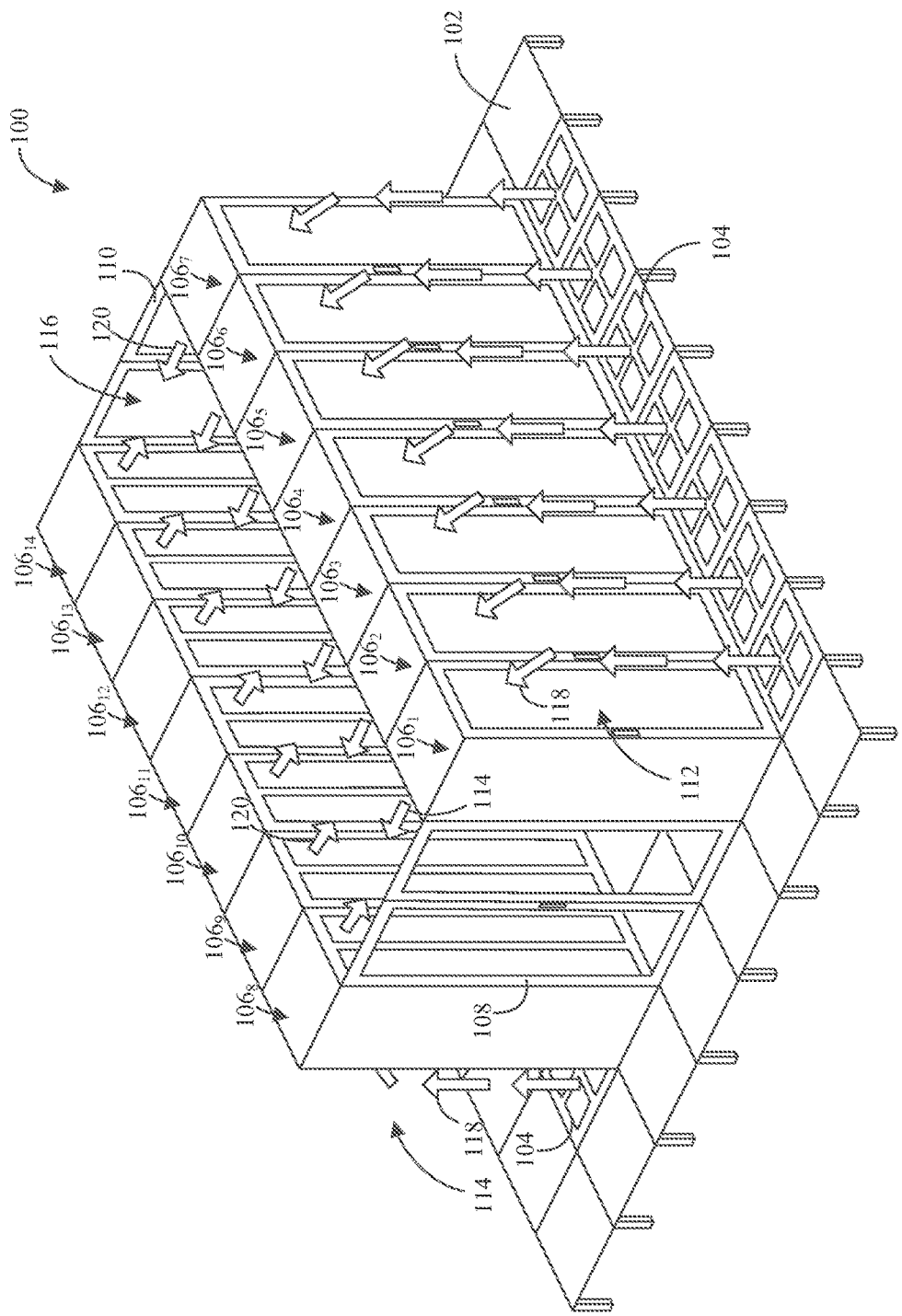
FIG. 1 is a perspective view of an example hot aisle containment system that may be implemented in a data center and that may benefit from the pressure anomaly detection and remediation embodiments described herein.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of persons skilled in the relevant art(s) to implement such feature, structure, or characteristic in connection with other embodiments whether or not explicitly described.

A system is described herein that is operable to automatically detect pressure anomalies within a data center, to generate an alert when such anomalies are detected, and to initiate actions to remediate the anomalies. In accordance with embodiments, the system monitors each of a plurality of fans used to dissipate heat generated by one or more servers in the data center. The fans may comprise, for example, server fans or blade chassis fans that blow air into a hot aisle containment unit. Through such monitoring, the system obtains data that indicates how an actual speed of each of the fans relates to a target speed of each of the fans. The system then compares the obtained data to reference data that indicates, for each of the plurality of fans, how an actual speed of the fan relates to a target speed of the fan in a substantially pressure-neutral environment. Based on the comparison, the system determines whether or not a pressure anomaly exists in the data center. If the system determines that a pressure anomaly exists in the data center, then the system may generate an alert and/or take steps to remediate the anomaly. Such steps may include, for example, modifying a manner of operation of one or more of the fans, and/or modifying a manner of operation of one or more of the servers.

Section II describes example hot aisle containment systems that may be implemented in a data center and technical problems that may arise when using such systems. Section III describes example data center management systems that can help solve such technical problems by automatically detecting pressure anomalies in a data center, raising alerts about such anomalies, and taking actions to remediate such anomalies. Section IV describes an example processor-based computer system that may be used to implement various embodiments described herein. Section V describes some additional exemplary embodiments. Section VI provides some concluding remarks.

II. Example Hot Aisle Containment Systems and Problems Associated Therewith

FIG. 1 is a perspective view of an example hot aisle containment system 100 that may be implemented in a data center and that may benefit from the pressure anomaly detection and remediation embodiments described herein. Hot aisle containment system 100 may be installed in a data center for a variety of reasons including, but not limited to, protecting data center computing equipment, conserving energy, and reducing cooling costs by managing air flow. Hot aisle containment system 100 is merely representative of one type of hot aisle containment system. Persons skilled in the relevant art(s) will appreciate that a wide variety of other approaches to implementing a hot aisle containment system may be taken, and that hot aisle containment systems implemented in accordance with such other approaches may also benefit from the pressure anomaly detection and remediation embodiments described herein.

As shown in FIG. 1, example hot aisle containment system 100 includes a plurality of server cabinets $106_1$-$106_{14}$ disposed on a floor 102 of a data center. Each server cabinet $106_1$-$106_{14}$ is configured to house a plurality of servers. Each server has at least one cold air intake and at least one hot air outlet. Each server is situated in a server cabinet such that the cold air intake(s) thereof are facing or otherwise exposed to one of two cold aisles 112, 114 while the hot air outlet(s) thereof are facing or otherwise exposed to a hot aisle 116. The physical structure of server cabinets $106_1$-$106_{14}$, the servers housed therein, and doors 108, 110 serve to isolate the air in cold aisles 112, 114 from the air in hot aisle 116. Still other structures or methods may be used to provide isolation between cold aisles 112, 114 and hot aisle 116. For example, foam or some other material may be inserted between the servers and the interior walls of server cabinets $106_1$-$106_{14}$ to provide further isolation between the air in cold aisles 112, 114 and the air in hot aisle 116. Additionally, in scenarios in which gaps exist between any of server cabinets $106_1$-$106_{14}$ or between any of server cabinets $106_1$-$106_{14}$ and the floor/ceiling, panels or other physical barriers may be installed to prevent air from flowing between hot aisle 116 and cold aisles 112, 114 through such gaps. The enclosure created around the hot aisle by these various structures may be referred to as a "hot aisle containment unit."

A cooling system (not shown in FIG. 1) produces cooled air 118 which is circulated into each of cold aisles 112, 114 via vents 104 in floor 102. A variety of other methods for circulating cooled air 118 into cold aisles 112, 114 may be used. For example, cooled air 118 may be circulated into each of cold aisles 112, 114 via vents in the walls at the end of a server row or vents in the ceiling. Fans integrated within the servers installed in server cabinets $106_1$-$106_{14}$ operate to draw cooled air 118 into the servers via the cold air intakes thereof. Cooled air 118 absorbs heat from the servers' internal components, thereby becoming heated air 120. Such heated air 120 is expelled by the server fans into hot aisle 116 via the server hot air outlets.

It is noted that the fans that draw cooled air 118 toward the server components and expel heated air 120 away from the server components need not be integrated within the servers themselves, but may also be externally located with respect to the servers. For example, in a scenario in which the servers comprise blade servers installed within a blade server chassis, the blade server chassis may itself include one or more fans that operate to draw cooled air 118 toward the blade servers and their components via one or more chassis cold air intakes and to expel heated air 120 away from the blade servers and their components via one or more chassis hot air outlets.

Heated air 120 within hot aisle 116 may be drawn therefrom by one or more exhaust fans or other airflow control mechanisms (not shown in FIG. 1). For example, heated air 120 may be drawn out of hot aisle 116 via vents in a ceiling disposed over hot aisle 116 and routed elsewhere using a system of ducts. Depending upon the implementation, heated air 120 or a portion thereof may be routed back to the cooling system to be cooled thereby and recirculated into cold aisles 112, 114. Heated air 120 or a portion thereof may also be vented from the data center to the outside world, or in colder climates, redirected back into the data center or an adjacent building or space to provide heating. In any case, direct recirculation of heated air 120 into cold aisles 112, 114 is substantially prevented. This helps to ensure that the temperature of the air that is drawn into the servers is kept at a level that does not exceed the operational specifications thereof, thereby avoiding damage to the servers' internal components. The foregoing features of hot aisle containment system 100 may also improve the energy efficiency of the data center and reduce cooling costs.

Figure 2:
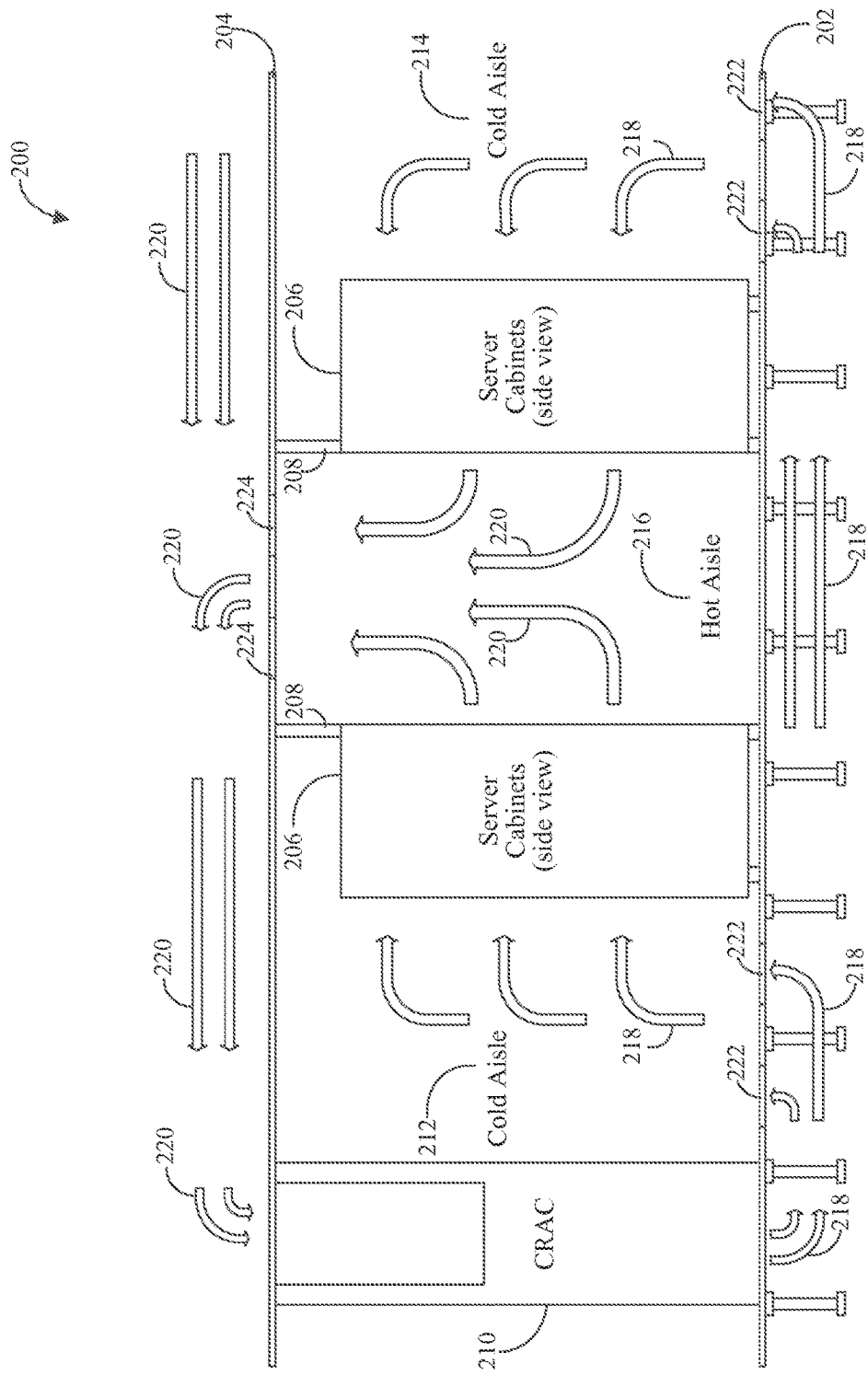
FIG. 2 is a side view of another example hot aisle containment system that may be implemented in a data center and that may benefit from the pressure anomaly detection and remediation embodiments described herein.

FIG. 2 is a side view of another example hot aisle containment system 200 that may be implemented in a data center and that may benefit from the pressure anomaly detection and remediation embodiments described herein.

Like hot aisle containment system 100, hot aisle containment system 200 is also representative of merely one type of hot aisle containment system.

As shown in FIG. 2, example hot aisle containment system 200 includes a plurality of server cabinets 206 disposed on a floor 202 of a data center. Each server cabinet 206 is configured to house a plurality of servers. Each server has at least one cold air intake and at least one hot air outlet. Each server is situated in a server cabinet 206 such that the cold air intake(s) thereof are facing or otherwise exposed to one of two cold aisles 212, 214 while the hot air outlet(s) thereof are facing or otherwise exposed to a hot aisle 216. The physical structure of server cabinets 206 and the servers housed therein serve to isolate the air in cold aisles 212, 214 from the air in hot aisle 216. Still other structures or methods may be used to provide isolation between cold aisles 212, 214 and hot aisle 216. For example, as further shown in FIG. 2, panels 208 may be installed between the tops of server cabinets 206 and ceiling 204 to further isolate the air in cold aisles 212, 214 from the air in hot aisle 216.

A computer room air conditioner (CRAC) 210 produces cooled air 218 that is blown into one or more channels that run under floor 202. Such cooled air 218 passes from these channel(s) into cold aisles 212, 214 via vents 222 in floor 202, although other means for venting cooled air 218 into cold aisles 212, 214 may be used. CRAC 210 may represent, for example, an air-cooled CRAC, a glycol-cooled CRAC or a water-cooled CRAC. Still other types of cooling systems may be used to produce cooled air 218, including but not limited to a computer room air handler (CRAH) and chiller, a pumped refrigerant heat exchanger and chiller, or a direct or indirect evaporative cooling system.

Fans integrated within the servers installed in server cabinets 206 operate to draw cooled air 218 into the servers via the cold air intakes thereof. Cooled air 218 absorbs heat from the servers' internal components, thereby becoming heated air 220. Such heated air 220 is expelled by the server fans into hot aisle 216 via the server hot air outlets. The fans that draw cooled air 218 toward the server components and expel heated air 220 away from the server components need not be integrated within the servers themselves, but may also be externally located with respect to the servers (e.g., such fans may be part of a blade server chassis).

Heated air 220 within hot aisle 216 may be drawn out of hot aisle 216 by one or more exhaust fans or other airflow control mechanism (not shown in FIG. 2). For example, heated air 220 may be drawn out of hot aisle 216 via vents 224 in a ceiling 204 disposed over hot aisle 216 and routed via one or more channels back to CRAC 210 to be cooled thereby and recirculated into cold aisles 212, 214. A portion of heated air 220 may also be vented from the data center to the outside world, or in colder climates, redirected back into the data center or an adjacent building or space to provide heating. In any case, direct recirculation of heated air 220 into cold aisles 212, 214 is substantially prevented. This helps to ensure that the temperature of the air that is drawn into the servers is kept at a level that does not exceed the operational specifications thereof, thereby avoiding damage to the servers' internal components. The foregoing features of hot aisle containment system 200 may also improve the energy efficiency of the data center and reduce cooling costs.

To obtain desired airflow, hot aisle containment systems 100, 200 may each be configured to maintain a slight negative pressure in the hot aisle. This may be achieved, for example, by utilizing one or more exhaust fans to draw a slightly greater volume of air per unit of time out of the hot aisle than is normally supplied to it during the same unit of time. By maintaining a slightly negative pressure in the hot aisle, air will tend to flow naturally from the cold aisles to the hot aisle. Furthermore, when a slightly negative pressure is maintained in the hot aisle, the server or blade chassis fans used to cool the servers' internal components will not be required to work as hard to blow or draw air over those components as they would if the pressure in the hot aisle exceeded that in the cold aisles.

Problems can occur, however, when a large group of server or blade chassis fans begin to operate in unison, thereby causing an extraordinary amount of air to flow into the hot aisle. This might occur for a variety of reasons. For example, such behavior could be caused by an increase in the ambient temperature in the cold aisles (e.g., if the normal ambient temperature in the cold aisles is 73° F., and the data center raises the ambient temperature to 85° F. due to a heat wave in the area). As another example, such behavior could be caused by a problem with the algorithms used to control server or blade chassis fan speeds. There may be still other causes. Regardless of the cause, such airflow into the hot aisle may surpass the exhaust capabilities of the hot aisle containment system, thereby generating a higher pressure in the hot aisle than in the cold aisles. A similar situation may arise if one or more exhaust fans that operate to draw air from the hot aisle stop working or become otherwise incapable of removing air from the hot aisle at the rate air is being blown into the hot aisle.

In these types of situations, as the pressure increases in the hot aisle, the heated air in the hot aisle containment unit can push out of containment panels and other openings into the cold aisle(s) and be drawn into nearby servers. These servers can exceed their specified thermal values and trip thermal alarms or possibly become damaged due to excessive heat. Excessive pressure in the hot aisle containment unit can also cause other environmental control components to be damaged. For example, exhaust fans that are used to draw hot air out of the hot aisle containment unit could potentially be damaged by the excessive pressure. In the following section, various data center management systems will be described that can help address such problems by automatically detecting pressure anomalies in a data center that includes a hot aisle containment system and taking actions to remediate such anomalies before equipment damage occurs.

Figure 3:
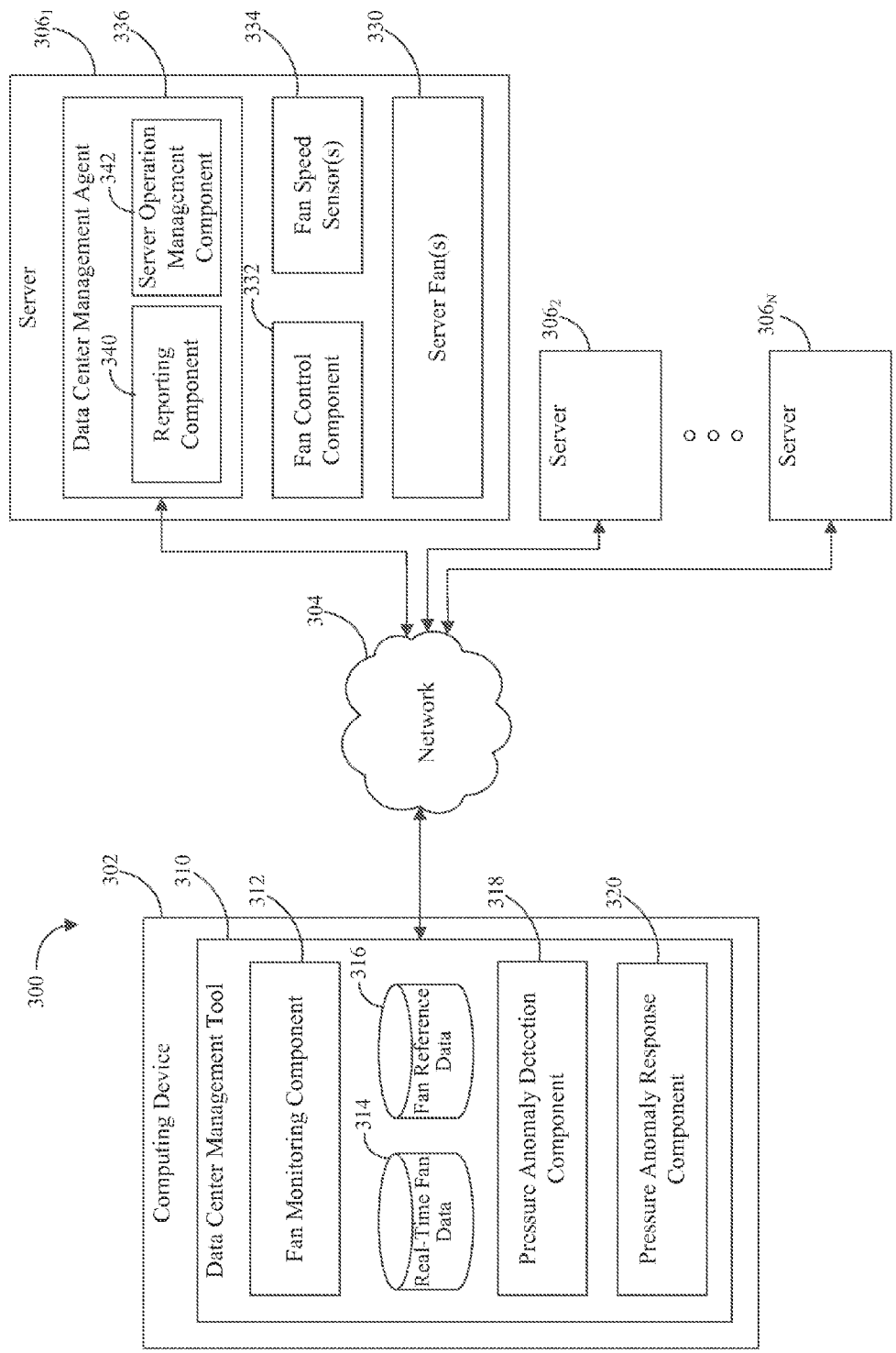
FIG. 3 is a block diagram of an example data center management system that is capable of automatically detecting pressure anomalies by monitoring server fans in a data center and taking certain actions in response to such detection.

III. Example Data Center Management Systems that Perform Automated Pressure Anomaly Detection and Remediation FIG. 3 is a block diagram of an example data center management system 300 that is capable of automatically detecting pressure anomalies in a data center and taking certain actions in response thereto. System 300 may be implemented, for example and without limitation, to detect and remediate pressure anomalies in a data center that implements a hot aisle containment system such as hot aisle containment system 100 discussed above in reference to FIG. 1, hot aisle containment system 200 discussed above in reference to FIG. 2, or some other type of hot aisle containment system.

As shown in FIG. 3, data center management system includes a computing device 302 and a plurality of servers $306_1$-$306_N$, each of which is connected to computing device 302 via a network 304. Computing device 302 is intended to represent a processor-based electronic device that is configured to execute software for performing certain data center management operations, some of which will be described herein. Computing device 302 may represent, for example, a desktop computer or a server. However, computing device 302 is not so limited, and may also represent other types of computing devices, such as a laptop computer, a tablet computer, a netbook, a wearable computer (e.g., a head-mounted computer), or the like.

Servers $306_1$-$306_N$ represent server computers located within a data center. Generally speaking, each of servers $306_1$-$306_N$ is configured to perform operations involving the provision of data to other computers. For example, one or more of servers $306_1$-$306_N$ may be configured to provide data to client computers over a wide area network, such as the Internet. Furthermore, one or more of servers $306_1$-$306_N$ may be configured to provide data to other servers, such as any other ones of servers $306_1$-$306_N$ or any other servers inside or outside of the data center within which servers $306_1$-$306_N$ reside. Each of servers $306_1$-$306_N$ may comprise, for example, a special-purpose type of server, such as a Web server, a mail server, a file server, or the like.

Network 304 may comprise a data center local area network (LAN) that facilitates communication between each of servers $306_1$-$306_N$ and computing device 302. However, this example is not intended to be limiting, and network 304 may comprise any type of network or combination of networks suitable for facilitating communication between computing devices. Network(s) 304 may include, for example and without limitation, a wide area network (e.g., the Internet), a personal area network, a private network, a public network, a packet network, a circuit-switched network, a wired network, and/or a wireless network.

As further shown in FIG. 3, server $306_1$ includes a number of components. These components include one or more server fans 330, a fan control component 332, one or more fan speed sensors 334, and a data center management agent 336. It is to be understood that each server $306_2$-$306_N$ includes instances of the same or similar components, but that these have not been shown in FIG. 3 due to space constraints and for ease of illustration.

Server fan(s) 330 comprise one or more mechanical devices that operate to produce a current of air. For example, each server fan 330 may comprise a mechanical device that includes a plurality of blades that are radially attached to a central hub-like component and that can revolve therewith to produce a current of air. Each server fan 330 may comprise, for example, a fixed-speed or variable-speed fan. Server fan(s) 330 are operable to generate airflow for the purpose of dissipating heat generated by one or more components of server $306_1$. Server components that may generate heat include but are not limited to central processing units (CPUs), chipsets, memory devices, network adapters, hard drives, power supplies, or the like.

In one embodiment, server $306_1$ includes one or more cold air intakes and one or more hot air outlets. In further accordance with such an embodiment, each server fan 330 may be operable to draw air into server $306_1$ via the cold air intake(s) and to expel air therefrom via the hot air outlet(s). In still further accordance with such an embodiment, the cold air intake(s) may be facing or otherwise exposed to a data center cold aisle and the hot air outlet(s) may be facing or otherwise exposed to a data center hot aisle. In this embodiment, each server fan 330 is operable to draw cooled air into server $306_1$ from the cold aisle and expel heated air therefrom into the hot aisle.

Fan control component 332 comprises a component that operates to control a speed at which each server fan 330 rotates. The fan speed may be represented, for example, in revolutions per minute (RPMs), and may range from 0 RPM (i.e., server fan is off) to some upper limit. The different fan speeds that can be achieved by a particular server fan will vary depending upon the fan type. Fan control component 332 may be implemented in hardware (e.g., using one or more digital and/or analog circuits), as software (e.g., software executing on one or more processors of server $306_1$), or as a combination of hardware and software.

Fan control component 332 may implement an algorithm for controlling the speed of each server fan 330. For example, fan control component 332 may implement an algorithm for selecting a target fan speed for each server fan 330 based on any number of ascertainable factors. For example, the target fan speed may be selected based on a temperature sensed by a temperature sensor internal to, adjacent to, or otherwise associated with server $306_1$, or based on a determined degree of usage of one or more server components, although these are only a few examples. It is also possible that fan control component 332 may select a target fan speed for each server fan 330 based on external input received from a data center management tool or other entity, as will be discussed elsewhere herein.

Although only a single fan control component 332 is shown in FIG. 3, it is possible that server $306_1$ may include multiple fan control components. For example, server $306_1$ may include different fan control components that operate to control the speed of different server fan(s), respectively.

Fan speed sensor(s) 334 comprise one or more sensors that operate to determine an actual speed at which each server fan 330 is operating. The actual speed at which a particular server fan 330 operates may differ from a target speed at which the server fan is being driven to operate as determined by fan control component 332. For example, although fan control component 332 may determine that a particular server fan 330 should be driven to operate at a speed of 2,100 RPM, in reality the particular server fan 330 may be operating at a speed of 2,072 RPM. The difference between the target speed and the actual speed may be due to a number of factors, including the design of the server fan itself, the design of the components used to drive the server fan, as well as the ambient conditions in which the server fan is operating. For example, if a higher pressure exists at the hot air outlet(s) of server $306_1$ than exists at the cold air inlets thereof, this may cause server fan(s) 330 to operate at a reduced actual speed relative to a desired target speed.

Any type of sensor that can be used to determine the speed of a fan may be used to implement fan speed sensor(s) 334. In one embodiment, fan speed sensor(s) 334 comprise one or more tachometers, although this example is not intended to be limiting.

Data center management agent 336 comprises a software component executing on one or more processors of server $306_1$ (not shown in FIG. 3). Generally speaking, data center management agent 336 performs operations that enable a remotely-executing data management tool to collect information about various operational aspects of server $306_1$ and that enable the remotely-executing data management tool to modify a manner of operation of server $306_1$.

Data center management agent 336 includes a reporting component 340. Reporting component 340 is operable to collect data concerning the operation of server fan(s) 330 and to send such data to the remotely-executing data center management tool. Such data may include, for example, a target speed of a server fan 330 as determined by fan control component 332 (or other component configured to select a target speed to which server fan 330 is to be driven) at a particular point in time or within a given timeframe as well as an actual speed of the server fan 330 as detected by a fan speed sensor 334 at the same point in time or within the same timeframe.

In an embodiment, reporting component 340 operates to intermittently collect a target speed and an actual speed of each server fan 330 and to send such target speed and actual speed data to the remotely-executing data center management tool. For example, reporting component 340 may operate to obtain such data on a periodic basis and provide it to the remotely-executing data center management tool. The exact times and/or rate at which such data collection and reporting is carried out by reporting component 340 may be fixed or configurable depending upon the implementation. In an embodiment, the remotely-executing data center management tool can specify when and/or how often such data collection and reporting should occur. The data collection and reporting may be carried out automatically by reporting component 340 and the data may then be pushed to the remotely-executing data center management tool. Alternatively, the data collection and reporting may be carried out by reporting component 340 only when the remotely-executing data center management tool requests (i.e., polls) reporting component 340 for the data.

As will be discussed elsewhere herein, the target and actual speed data for each server fan 330 that is conveyed by reporting component 340 to the remotely-executing data center management tool can be used by the remotely-executing data center management tool to determine if a pressure anomaly exists in the data center.

Data center management agent 336 also includes a server operation management component 342. Server operation management component 342 is operable to receive instructions from the remotely-executing data center management tool, and in response to those instructions, change a manner of operation of server $306_1$. As will be discussed elsewhere herein, the change in manner of operation of server $306_1$ may be intended to remediate or otherwise mitigate a pressure anomaly that has been detected within the data center in which server $306_1$ resides. The ways in which server operation management component 342 may change the manner of operation of server $306_1$ may include but are not limited to: changing (e.g., reducing) a speed of one or more server fans 330, causing data center management agent 336 to begin monitoring and reporting the temperature of internal server components to the remotely-executing data center management tool (or increasing a rate at which such monitoring/reporting occurs), terminating at least one process executing on server $306_1$ and/or discontinuing the use of at least one resource of server $306_1$ (e.g., pursuant to the migration of a customer workflow to another server), reducing an amount of power supplied to one or more internal components of server $306_1$, or shutting down server $306_1$ entirely.

As further shown in FIG. 3, computing device 302 includes a data center management tool 310. Data center management tool 310 comprises a software component that is executed by one or more processors of computing device 302 (not shown in FIG. 3). Generally speaking, data center management tool 310 is operable to collect operational data from each of servers $306_1$-$306_N$ relating to the target and actual fan speeds of those servers and to use such operational data to determine if a pressure anomaly exists within the data center in which those servers are located. Furthermore, data center management tool 310 is operable to take certain actions in response to determining that such a pressure anomaly exists such as generating an alert and/or changing a manner of operation of one or more of servers $306_1$-$306_N$ in a manner intended to remediate the anomaly.

Data center management tool 310 includes a fan monitoring component 312, a pressure anomaly detection component 318, and a pressure anomaly response component 320. In order to perform its operations, data center management tool 310 is operable to access real-time fan data 314 and fan reference data 316. Real-time fan data 314 and fan reference data 316 may each be stored in volatile and/or non-volatile memory within computing device 302 or may be stored in one or more volatile and/or non-volatile memory devices that are external to computing device 302 and communicatively connected thereto for access thereby. Real-time fan data 314 and fan reference data 316 may each be data that is stored separately from data center management tool 310 and accessed thereby or may be data that is internally stored with respect to data center management tool 310 (e.g., within one or more data structures of data center management tool 310).

Fan monitoring component 312 is operable to collect information from a reporting component installed on each of servers $306_1$-$306_N$ (e.g., reporting component 340 installed on server $306_1$), wherein such information includes operational information about one or more server fans on each of servers $306_1$-$306_N$. As was previously described, such information may include target speed and actual speed data for each monitored server fan on servers $306_1$-$306_N$. Fan monitoring component 312 stores such operational information as part of real-time fan data 314. Such real-time fan data 314 may comprise the raw target and actual fan speed data received from servers $306_1$-$306_N$, or it may comprise a processed version thereof. For example, fan monitoring component 312 may perform certain operations (e.g., filtering, time-averaging, smoothing, error correcting, or the like) on the raw target and actual fan speed data before storing it as real-time fan data 314.

Pressure anomaly detection component 318 is operable to compare the obtained real-time fan data 314 to fan reference data 314 to determine whether a pressure anomaly exists in the data center in which servers $306_1$-$306_N$ reside. Fan reference data 314 is data that indicates, for each server fan that is monitored by fan monitoring component 312, how an actual speed of the server fan relates to a target speed of the server fan in a substantially pressure-neutral environment (i.e., in an environment in which the pressure at the cold air intake(s) of the server is at least roughly equivalent to the pressure at the hot air outlet(s) thereof). By comparing the target-vs-actual speed data that is obtained during operation of the server fans to the reference target-vs-actual speed data for the same server fans in a substantially-pressure neutral environment, pressure anomaly detection component 318 is able to determine whether or not a pressure anomaly exists in the data center. Specific details concerning how fan reference data 314 may be obtained and how pressure anomaly detection component 318 is able to detect pressure anomalies by comparing real-time fan data 314 to fan reference data 316 will be provided below with respect to FIGS. 5 and 6.

Pressure anomaly response component 320 is operable to perform certain actions automatically in response to the detection of a pressure anomaly by pressure anomaly detection component 318. For example, pressure anomaly response component 320 may generate an alert or send instructions to one or more of servers $306_1$-$306_N$ to cause those servers to change their manner of operation. Such changes may be intended to remediate the pressure anomaly. Specific details concerning the automatic responses that may be performed by pressure anomaly response component 320 in response to the detection of a pressure anomaly will be provided below with respect to FIG. 7.

Depending upon the implementation, computing device 302 may be located in the same data center as servers $306_1$-$306_N$ or may be located remotely with respect to the data center. Furthermore, it is possible that various subsets of servers $306_1$-$306_N$ may be located in different data centers. In such a scenario, data management tool 310 may be capable of detecting pressure anomalies in different data centers and responding to or remediating the same.

Furthermore, although data center management tool 310 is shown as part of computing device 302, in alternate implementations, data center management tool may be installed and executed on any one or more of servers $306_1$-$306_N$. For example, an instance of data center management tool 310 may be installed and executed on one of servers $306_1$-$306_N$ and operate to perform pressure anomaly detection and remediation for servers $306_1$-$306_N$. Alternatively, an instance of data center management tool 310 may be installed and executed on one server in each of a plurality of subset of servers $306_1$-$306_N$ and operate to perform pressure anomaly detection and remediation for the servers in that subset.

FIG. 3 depicts a data center management system 300 in which server fans are monitored and information obtained thereby is used to detect pressure anomalies. However, other types of fans used to dissipate heat generated by servers in a data center may be monitored in accordance with embodiments and information obtained thereby can also be used to detect pressure anomalies. By way of example only, FIG. 4 depicts an alternate data center management system 400 in which blade server chassis fans are monitored and information obtained thereby is used to detect pressure anomalies.

Figure 4:
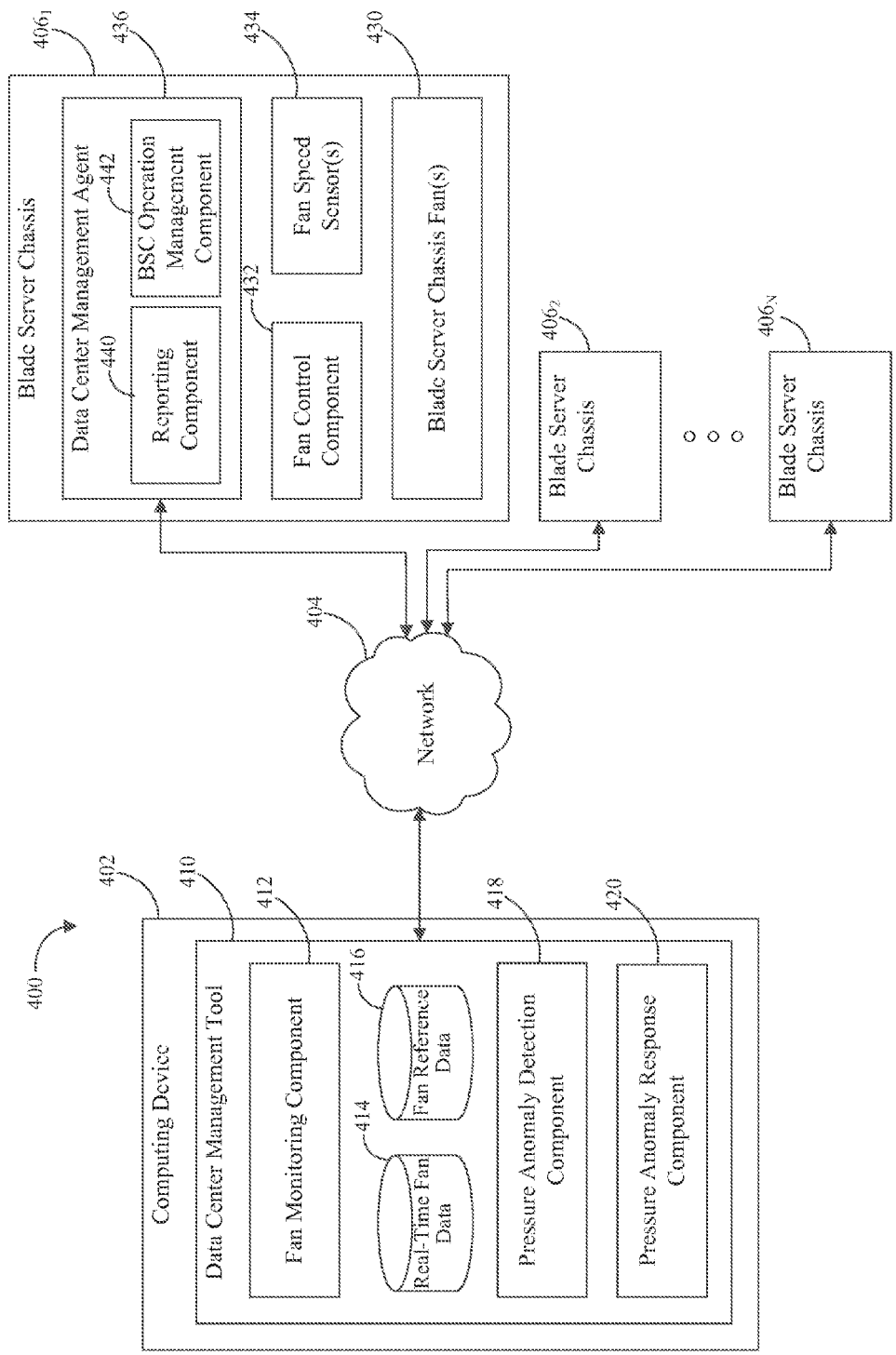
FIG. 4 is a block diagram of an example data center management system that is capable of automatically detecting pressure anomalies by monitoring blade server chassis fans in a data center and taking certain actions in response to such detection.

As shown in FIG. 4, data center management system includes a computing device 402 that executes a data center management tool 410 and a plurality of blade server chassis $406_1$-$406_N$, each of which is connected to computing device 402 via a network 404. Computing device 402, data center management tool 410, and network 404 may be substantially similar to previously-described computing device 302, data center management tool 310 and network 304, respectively, except that data center management tool 410 is configured to collect blade server chassis fan operational information as opposed to server fan operational information and to detect pressure anomalies via an analysis thereof.

To this end, data center management tool 410 includes a fan monitoring component 412, a pressure anomaly detection component 418 and a pressure anomaly response component 420 that may operate in a substantially similar manner to fan monitoring component 312, pressure anomaly detection component 318, and pressure anomaly response component 320, respectively, as described above in reference to FIG. 3. Furthermore, data center management tool 410 is operable to access real-time fan data 414 and fan reference data 416 which may be substantially similar to real-time fan data 314 and fan reference data 316 except that such data may refer to blade server chassis fans as opposed to server fans.

Blade server chassis $406_1$-$406_N$ represent blade server chassis located within a data center. Generally speaking, each of blade server chassis $406_1$-$406_N$ is configured to house one or more blade servers. As further shown in FIG. 4, blade server chassis $406_1$ includes a number of components. These components include one or more blade chassis fans 430, a fan control component 432, one or more fan speed sensors 434, and a data center management agent 436. It is to be understood that each blade server chassis $406_2$-$406_N$ includes instances of the same or similar components, but that these have not been shown in FIG. 4 due to space constraints and for ease of illustration.

Blade chassis server fan(s) 430 comprise one or more mechanical devices that operate to produce a current of air. For example, each blade server chassis fan 430 may comprise a mechanical device that includes a plurality of blades that are radially attached to a central hub-like component and that can revolve therewith to produce a current of air. Each blade server chassis fan 430 may comprise, for example, a fixed-speed or variable-speed fan. Blade server chassis fan(s) 430 are operable to generate airflow for the purpose of dissipating heat generated by one or more blade servers installed within blade server chassis $406_1$.

In one embodiment, blade server chassis $406_1$ includes one or more cold air intakes and one or more hot air outlets. In further accordance with such an embodiment, each blade server chassis fan 430 may be operable to draw air into blade server chassis $406_1$ via the cold air intake(s) and to expel air therefrom via the hot air outlet(s). In still further accordance with such an embodiment, the cold air intake(s) may be facing or otherwise exposed to a data center cold aisle and the hot air outlet(s) may be facing or otherwise exposed to a data center hot aisle. In this embodiment, each blade server chassis fan 430 is operable to draw cooled air into blade server chassis $406_1$ from the cold aisle and expel heated air therefrom into the hot aisle.

Fan control component 432 comprises a component that operates to control a speed at which each blade server chassis fan 430 rotates. The fan speed may range from 0 RPM (i.e., server fan is off) to some upper limit. The different fan speeds that can be achieved by a particular blade server chassis fan will vary depending upon the fan type. Fan control component 432 may be implemented in hardware (e.g., using one or more digital and/or analog circuits), as software (e.g., software executing on one or more processors of blade server chassis $406_1$), or as a combination of hardware and software.

Fan control component 432 may implement an algorithm for controlling the speed of each blade server chassis fan 430. For example, fan control component 432 may implement an algorithm for selecting a target fan speed for each blade server chassis fan 430 based on any number of ascertainable factors. For example, the target fan speed may be selected based on a temperature sensed by a temperature sensor internal to, adjacent to, or otherwise associated with blade server chassis $406_1$, or based on a determined degree of usage of one or more blade server components, although these are only a few examples. It is also possible that fan control component 432 may select a target fan speed for each blade server chassis fan 430 based on external input received from a data center management tool or other entity, as will be discussed elsewhere herein.

Although only a single fan control component 432 is shown in FIG. 4, it is possible that blade server chassis $406_1$ may include multiple fan control components. For example, blade server chassis $406_1$ may include different fan control components that operate to control the speed of different blade server chassis fan(s), respectively.

Fan speed sensor(s) 434 comprise one or more sensors that operate to determine an actual speed at which each blade server chassis fan 430 is operating. Any type of sensor that can be used to determine the speed of a fan may be used to implement fan speed sensor(s) 434. In one embodiment, fan speed sensor(s) 434 comprise one or more tachometers, although this example is not intended to be limiting.

Data center management agent 436 comprises a software component executing on one or more processors of blade server chassis 406$_1$ (not shown in FIG. 4). Generally speaking, data center management agent 436 performs operations that enable remotely-executing data management tool 410 to collect information about various operational aspects of blade server chassis 406$_1$ and that enable remotely-executing data management tool 410 to modify a manner of operation of blade server chassis 406$_1$.

Data center management agent 436 includes a reporting component 440. Reporting component 440 is operable to collect data concerning the operation of blade server chassis fan(s) 430 and to send such data to remotely-executing data center management tool 410. Such data may include, for example, a target speed of a blade server chassis fan 430 as determined by fan control component 432 (or other component configured to select a target speed to which blade server chassis fan 430 is to be driven) at a particular point in time or within a given timeframe as well as an actual speed of the blade server chassis fan 430 as detected by a fan speed sensor 434 at the same point in time or within the same timeframe. In an embodiment, reporting component 440 operates to intermittently collect a target speed and an actual speed of each blade server chassis fan 430 and to send such target speed and actual speed data to remotely-executing data center management tool 410. The target and actual speed data for each blade server chassis fan 430 that is conveyed by reporting component 440 to remotely-executing data center management tool 410 can be used by remotely-executing data center management tool 410 to determine if a pressure anomaly exists in the data center.

Data center management agent 336 also includes a blade server chassis (BSC) operation management component 442. BSC operation management component 442 is operable to receive instructions from remotely-executing data center management tool 410, and in response to those instructions, change a manner of operation of blade server chassis 406$_1$. As will be discussed elsewhere herein, the change in manner of operation of blade server chassis 406$_1$ may be intended to remediate or otherwise mitigate a pressure anomaly that has been detected within the data center in which blade server chassis 406$_1$ resides. The ways in which BSC operation management component 442 may change the manner of operation of blade server chassis 406$_1$ may include but are not limited to changing (e.g., reducing) a speed of one or more blade server chassis fans 430, causing data center management agent 436 to begin monitoring and reporting the temperature of blade servers and/or blade server components to remotely-executing data center management tool 410 (or increasing at rate at which such monitoring/reporting occurs), or shutting down blade server chassis 406$_1$ entirely.

In an embodiment, a data center management agent may also be installed on each blade server installed within blade server chassis 406$_1$. These agents may be used by data center management tool 410 to carry out blade-server-specific remediation actions such as but not limited to: terminating at least one process executing on a blade server and/or discontinuing the use of at least one resource of a blade server (e.g., pursuant to the migration of a customer workflow to another server), reducing an amount of power supplied to one or more components of a blade server, or shutting down a blade server entirely.

In a further embodiment of a data center management system, server fans included in one or more servers and blade server chassis fans included in one or more blade chassis are monitored and information obtained thereby is used to detect pressure anomalies. In further accordance with such an embodiment, remediation actions can be taken by changing the manner of operation of one or more servers, server fans, blade server chassis, blade server chassis fans, or blade servers.

Figure 5:
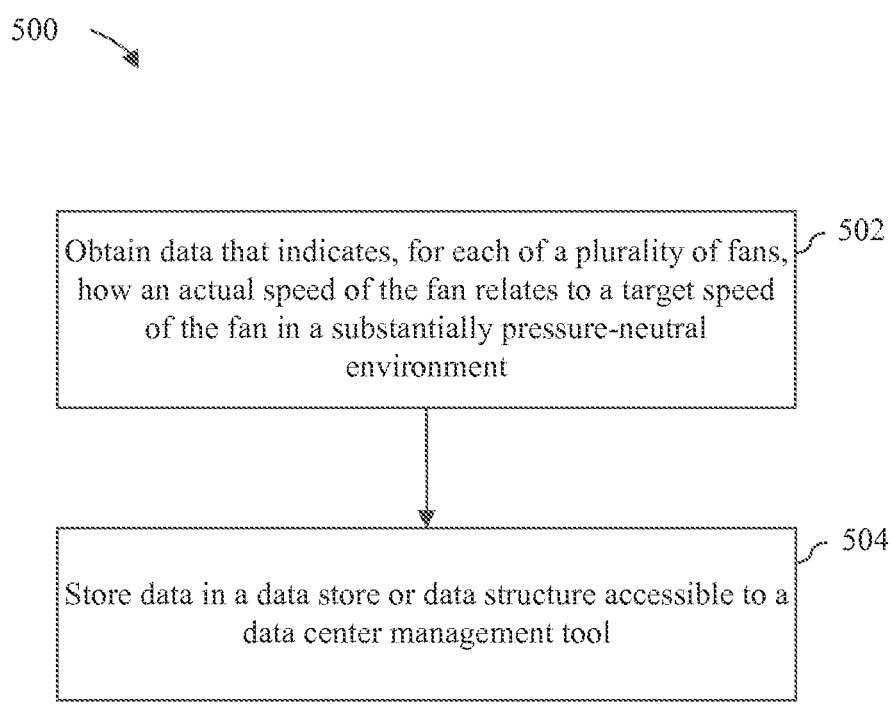
FIG. 5 depicts a flowchart of a method for generating fan reference data that indicates, for each of a plurality of fans, how an actual speed of the fan relates to a target speed of the fan in a substantially pressure-neutral environment.

FIG. 5 depicts a flowchart 500 of one example method for generating fan reference data 316, 416 as described above in reference to FIGS. 3 and 4, respectively. The method of flowchart 500 is described herein by way of example only and is not intended to be limiting. Persons skilled in the relevant art(s) will appreciated that other techniques may be used to generate fan reference data 316, 416.

As shown in FIG. 5, the method of flowchart 500 begins at step 502 in which data is obtained that indicates, for each of a plurality of fans, how an actual speed of the fan relates to a target speed of the fan in a substantially pressure-neutral environment. Each fan may comprise, for example, a server fan or a blade server chassis fan. A substantially pressure-neutral environment may comprise an environment in which the pressure at the fan inlet is roughly or substantially equivalent to the pressure at the fan outlet.

Such data may be obtained, for example, by testing a fan using tachometer or other suitable sensor while the fan is operating in a substantially pressure-neutral environment to determine how the actual speed of the fan compares to the target speed to which the fan is being driven. Such data may also be obtained by calibrating the design of a fan so that it operates at a particular actual speed when being driven to a particular target speed. Such data may further be obtained from product specifications associated with a particular fan. The data obtained during step 500 may refer to an individual fan only or to a particular type of fan (e.g., a particular brand or model of fan).

The data that is obtained during step 500 may indicate, for a particular fan or fan type, how the actual speed of the fan relates to the desired target speed of the fan for multiple different target speeds. For example, for a variable speed fan, a range of actual fan speeds may be determined that relate to a corresponding range of target speeds. In further accordance with this example, a range of actual fan speeds may be determined that relate to a target speed range of 0 RPM to some maximum RPM.

At step 504, the data obtained during step 502 in stored in a data store or data structure that is accessible to a data center management tool, such as either of data center management tool 310 of FIG. 3 or data center management tool 410 of FIG. 4. By way of example, the data obtained during step 502 may be stored in a data store that separate from data center management tool 310, 410 and accessed thereby or may be data that is internally stored with respect to data center management tool 310, 410 (e.g., within one or more data structures of data center management tool 310, 410).

Figure 6:
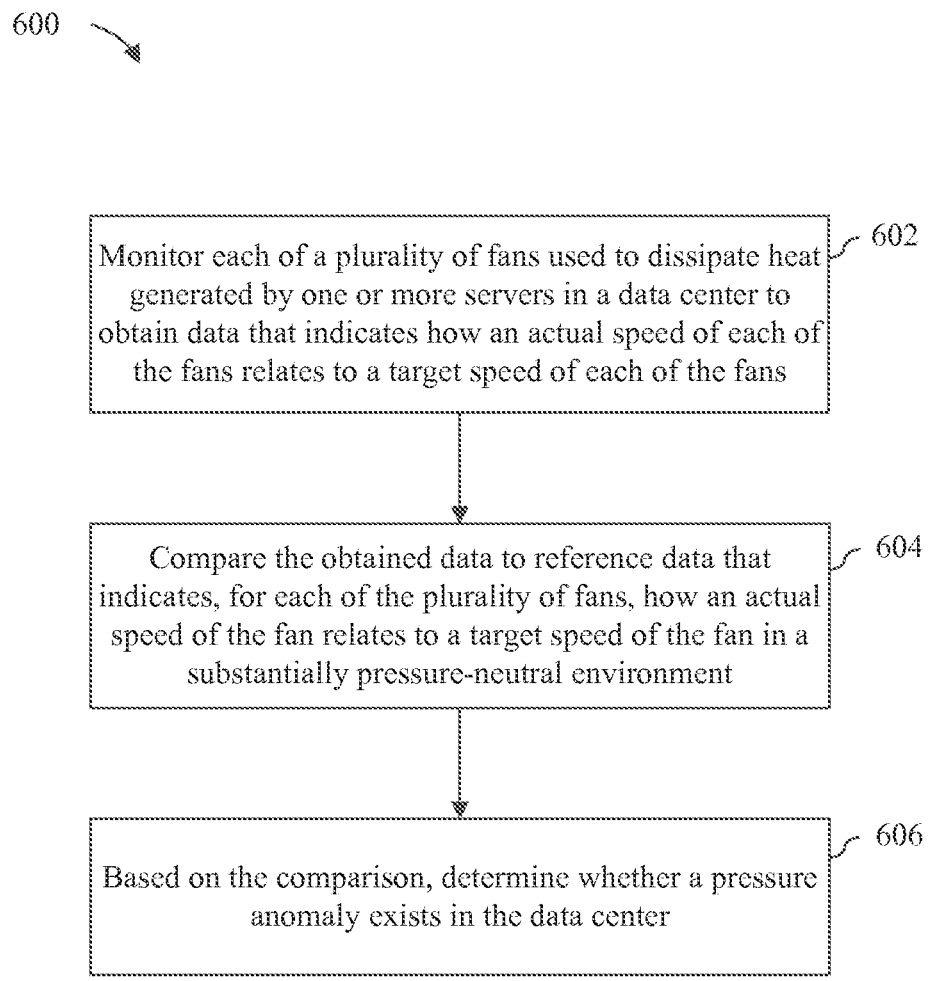
FIG. 6 depicts a flowchart of a method for automatically detecting a pressure anomaly within a data center in accordance with an embodiment.

FIG. 6 depicts a flowchart 600 of a method for automatically detecting a pressure anomaly within a data center in accordance with an embodiment. The method of flowchart 600 may be performed, for example, by data center management tool 310 of FIG. 3 or data center management tool 410 of FIG. 4 and therefore will be described herein with continued reference to those embodiments. However, the method is not limited to those embodiments.

As shown in FIG. 6, the method of flowchart 600 begins at step 602, during which each of a plurality of fans used to dissipate heat generated by one or more servers in a data center is monitored to obtain data that indicates how an actual speed of each of the fans relates to a target speed of each of the fans. The fans may be, for example, server fans and/or blade server chassis fans. This step may be performed, for example, by fan monitoring component 312 of data center management tool 310 (as described above in reference to FIG. 3) or fan monitoring component 412 of data center management tool 410 (as described above in reference to FIG. 4). As was previously described, these components can collect such data from data center management agents executing on the servers or blade server chassis that house such servers. As was also previously described, such data may be stored as real-time fan data 314, 414.

At step 604, the data obtained during step 602 is compared to reference data that indicates, for each of the plurality of fans, how an actual speed of the fan relates to a target speed of the fan in a substantially pressure-neutral environment. This step may be performed, for example, by pressure anomaly detection component 318 of data center management tool 310 (as described above in reference to FIG. 3) or pressure anomaly detection component 418 of data center management tool 410 (as described above in reference to FIG. 4). This step may comprise, for example, comparing real-time fan data 314 to fan reference data 316 or comparing real-time fan data 414 to fan reference data 416.

At step 606, based at least on the comparison conducted during step 604, it is determined whether a pressure anomaly exists in the data center. Like step 604, this step may also be performed, for example, by pressure anomaly detection component 318 or pressure anomaly detection component 418.

The comparing carried out in step 604 between the data obtained during step 602 and the reference data may comprise, for example, determining a measure of difference or deviation between an actual-to-target speed relationship specified by the data obtained during step 602 and an actual-to-target speed relationship specified by the reference data. For example, if a particular degree of deviation between the obtained data actual-to-target speed relationship and the reference data actual-to-target speed relationship is observed or if a particular pattern of deviation is observed over time, then pressure anomaly detection component 318, 418 may determine that a pressure anomaly exists. By way of example, in a scenario in which a positive pressure is building up in a hot aisle containment unit relative to one or more adjacent cold aisles, one might expect to see that the actual speed achieved by fans blowing heated air into the hot aisle containment unit for a given target speed will be lower than that obtained for the same target speed in a substantially pressure-neutral environment.

In one embodiment, pressure anomaly detection component 318, 418 may determine that a pressure anomaly exists if the measure of difference for a particular number of the fans exceeds a particular threshold. This approach recognizes that a pressure anomaly such as that described above (i.e., a positive pressure is building up in a hot aisle containment unit relative to one or more adjacent cold aisles) may be likely to significantly impact the behavior of a large number of fans. For example, if an N % or greater deviation from a reference actual-to-target speed relationship is observed for M % or greater of the monitored fan population, then pressure anomaly detection component 318, 418 may determine that a pressure anomaly exists. In addition to the foregoing, pressure anomaly detection component 318, 418 may consider the proximity or location of the fans for which deviations from a reference actual-to-target speed relationship is being reported.

Figure 7:
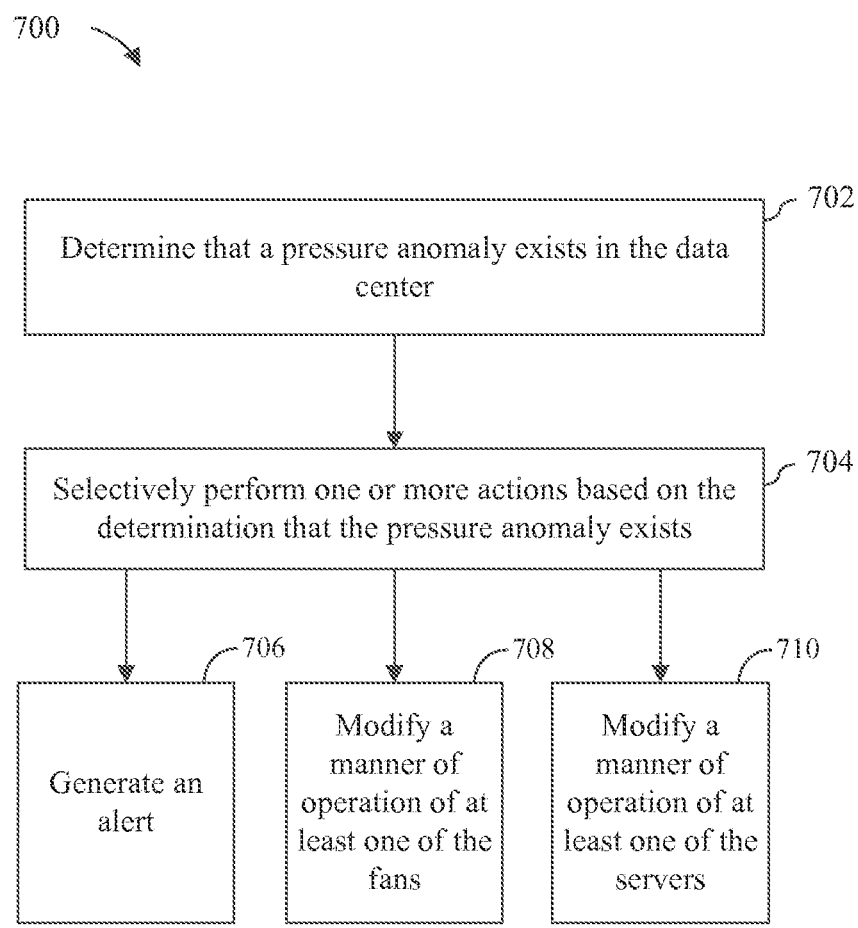
FIG. 7 depicts a flowchart of a method for automatically taking actions in response to the detection of a pressure anomaly within a data center in accordance with an embodiment.

FIG. 7 depicts a flowchart 700 of a method for automatically taking actions in response to the detection of a pressure anomaly within a data center in accordance with an embodiment. The method of flowchart 700 may be performed, for example, by data center management tool 310 of FIG. 3 or data center management tool 410 of FIG. 4 and therefore will be described herein with continued reference to those embodiments. However, the method is not limited to those embodiments.

As shown in FIG. 7, the method of flowchart begins at step 702, in which it is determined that a pressure anomaly exists in the data center. This step is analogous to step 606 of flowchart 600 and thus may be performed in a manner described above with reference to that flowchart. Step 702 may be performed, for example, by pressure anomaly detection component 318 or pressure anomaly detection component 418.

At step 704, in response to the determination in step 702 that a pressure anomaly exists in the data center, one or more actions are selectively performed. This step may be performed, for example, by pressure anomaly response component 320 of data center management tool 310 (as described above in reference to FIG. 3) or pressure anomaly response component 420 of data center management tool 410 (as described above in reference to FIG. 4).

Steps 706, 708 and 710 show various types of actions that may be selectively performed in response to the determination that a pressure anomaly exists. Each of these steps may be carried out in isolation or in conjunction with one or more other steps.

In step 706, an alert is generated. This alert may be audible, visible and/or haptic in nature. The alert may be generated, for example, via a user interface of computing device 302, computing device 402, or via a user interface of a computing device that is communicatively connected thereto. The alert may be recorded in a log. The alert may also be transmitted to another device or to a user in the form of a message, e-mail or the like. By generating an alert in this manner, data center personnel can be notified of the pressure anomaly as soon as it is detected, thereby enabling them to take steps to help remediate the issue.

In step 708, the manner of operation of at least one of the fans used to cool the servers is modified. For example, in an embodiment, pressure anomaly response component 320 may send commands to server operation management components 342 executing on servers $306_1$-$306_N$ to cause the speed of certain server fans that are determined to be associated with the pressure anomaly to be reduced. Likewise, pressure anomaly response component 420 may send commands to BSC operation management components 442 executing on blade server chassis $406_1$-$406_N$ to cause the speed of certain blade server chassis fans that are determine to be associated with the pressure anomaly to be reduced. This may have the effect of reducing the pressure within a hot aisle containment unit toward which the fans are blowing heated air, thereby helping to remediate the pressure anomaly.

In an embodiment, after pressure anomaly response component 310, 410 reduces the speed of one or more fans, pressure anomaly response component 310, 410 may also begin to monitor the temperature of internal server components via data center management agents 336, 436 (or increase the rate at which such information is reported) so that pressure anomaly response component 310, 410 can determine whether the reduction of the fan speed is going to cause those components to exceed specified thermal limits and potentially be damaged. If pressure anomaly response component 310, 410 determines that the reduction of the fan speed is going to cause those components to exceed specified thermal limits and potentially be damaged, then pressure anomaly response component 310, 410 may take additional steps, such as increasing fan speeds or shutting down one or more servers.

In step 710, the manner of operation of at least one of the servers in the data center is modified. For example, in an embodiment, pressure anomaly response component 310, 410 may interact with data center management agents to shut down one or more of the servers that are determined to be impacted by the pressure anomaly. As another example, to ensure that customer service level agreements (SLAs) are satisfied, pressure anomaly response component 310, 410 may operate to migrate one or more customer workflows from servers that are determined to be impacted by the pressure anomaly to servers that are not. As yet another example, pressure anomaly response component 310, 410 may interact with data center management agents to reduce an amount of power supplied to one or more internal components of a server that is determined to be impacted by the pressure anomaly, which can have the effect of reducing the temperature of such internal components.

The foregoing are only some examples of the steps that may be taken by pressure anomaly response component 320, 420 to try and remediate a detected pressure anomaly. Since such steps can be carried out automatically, they can help remediate a pressure anomaly before equipment damage is caused and without requiring intervention by data center personnel.

IV. Example Computer System Implementation

Figure 8:
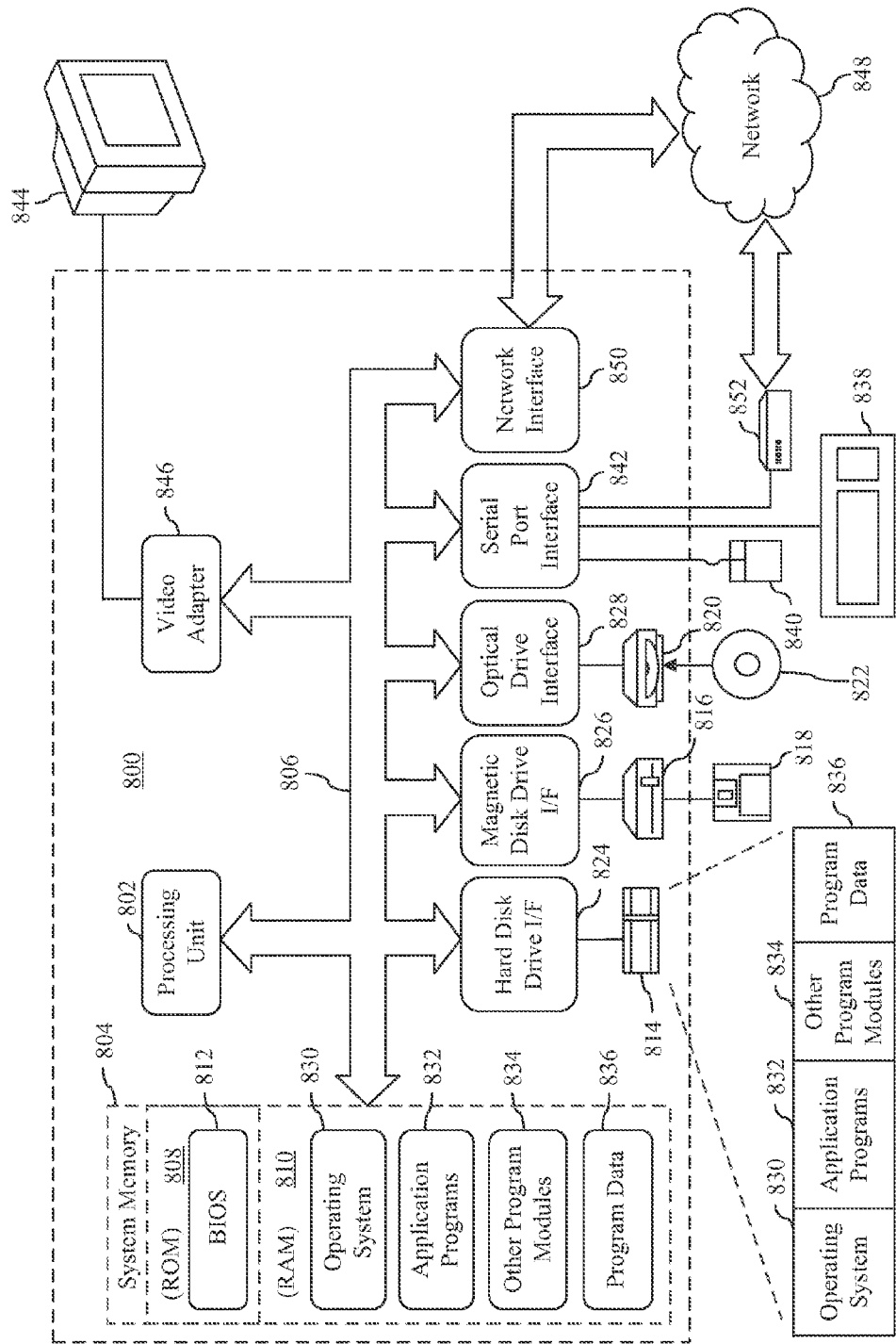
FIG. 8 is a block diagram of an example processor-based computer system that may be used to implement various embodiments.

FIG. 8 depicts an example processor-based computer system 800 that may be used to implement various embodiments described herein. For example, computer system 800 may be used to implement computing device 302, any of servers $306_1$-$306_N$, computing device 402, blade server chassis $406_1$-$406_N$, or any of the blade servers installed therein. Computer system 800 may also be used to implement any or all of the steps of any or all of the flowcharts depicted in FIGS. 5-7. The description of computer system 800 is provided herein for purposes of illustration, and is not intended to be limiting. Embodiments may be implemented in further types of computer systems, as would be known to persons skilled in the relevant art(s).

As shown in FIG. 8, computer system 800 includes a processing unit 802, a system memory 804, and a bus 806 that couples various system components including system memory 804 to processing unit 802. Processing unit 802 may comprise one or more microprocessors or microprocessor cores. Bus 806 represents one or more of any of several types of bus structures, including a memory bus or memory controller, a peripheral bus, an accelerated graphics port, and a processor or local bus using any of a variety of bus architectures. System memory 804 includes read only memory (ROM) 808 and random access memory (RAM) 810. A basic input/output system 812 (BIOS) is stored in ROM 808.

Computer system 800 also has one or more of the following drives: a hard disk drive 814 for reading from and writing to a hard disk, a magnetic disk drive 816 for reading from or writing to a removable magnetic disk 818, and an optical disk drive 820 for reading from or writing to a removable optical disk 822 such as a CD ROM, DVD ROM, BLU-RAY™ disk or other optical media. Hard disk drive 814, magnetic disk drive 816, and optical disk drive 820 are connected to bus 806 by a hard disk drive interface 824, a magnetic disk drive interface 826, and an optical drive interface 828, respectively. The drives and their associated computer-readable media provide nonvolatile storage of computer-readable instructions, data structures, program modules and other data for the computer. Although a hard disk, a removable magnetic disk and a removable optical disk are described, other types of computer-readable memory devices and storage structures can be used to store data, such as flash memory cards, digital video disks, random access memories (RAMs), read only memories (ROM), and the like.

A number of program modules may be stored on the hard disk, magnetic disk, optical disk, ROM, or RAM. These program modules include an operating system 830, one or more application programs 832, other program modules 834, and program data 836. In accordance with various embodiments, the program modules may include computer program logic that is executable by processing unit 802 to perform any or all of the functions and features of computing device 302, any of servers $306_1$-$306_N$, computing device 402, blade server chassis $406_1$-$406_N$, or any of the blade servers installed therein, as described above. The program modules may also include computer program logic that, when executed by processing unit 802, performs any of the steps or operations shown or described in reference to the flowcharts of FIGS. 5-7.

A user may enter commands and information into computer system 800 through input devices such as a keyboard 838 and a pointing device 840. Other input devices (not shown) may include a microphone, joystick, game controller, scanner, or the like. In one embodiment, a touch screen is provided in conjunction with a display 844 to allow a user to provide user input via the application of a touch (as by a finger or stylus for example) to one or more points on the touch screen. These and other input devices are often connected to processing unit 802 through a serial port interface 842 that is coupled to bus 806, but may be connected by other interfaces, such as a parallel port, game port, or a universal serial bus (USB). Such interfaces may be wired or wireless interfaces.

A display 844 is also connected to bus 806 via an interface, such as a video adapter 846. In addition to display 844, computer system 800 may include other peripheral output devices (not shown) such as speakers and printers.

Computer system 800 is connected to a network 848 (e.g., a local area network or wide area network such as the Internet) through a network interface or adapter 850, a modem 852, or other suitable means for establishing communications over the network. Modem 852, which may be internal or external, is connected to bus 806 via serial port interface 842.

As used herein, the terms "computer program medium," "computer-readable medium," and "computer-readable storage medium" are used to generally refer to memory devices or storage structures such as the hard disk associated with hard disk drive 814, removable magnetic disk 818, removable optical disk 822, as well as other memory devices or storage structures such as flash memory cards, digital video disks, random access memories (RAMs), read only memories (ROM), and the like. Such computer-readable storage media are distinguished from and non-overlapping with communication media (do not include communication media). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media. Embodiments are also directed to such communication media.

As noted above, computer programs and modules (including application programs 832 and other program modules 834) may be stored on the hard disk, magnetic disk, optical disk, ROM, or RAM. Such computer programs may also be received via network interface 850, serial port interface 842, or any other interface type. Such computer programs, when executed or loaded by an application, enable computer system 800 to implement features of embodiments of the present invention discussed herein. Accordingly, such computer programs represent controllers of computer system 800.

Embodiments are also directed to computer program products comprising software stored on any computer useable medium. Such software, when executed in one or more data processing devices, causes a data processing device(s) to operate as described herein. Embodiments of the present invention employ any computer-useable or computer-readable medium, known now or in the future. Examples of computer-readable mediums include, but are not limited to memory devices and storage structures such as RAM, hard drives, floppy disks, CD ROMs, DVD ROMs, zip disks, tapes, magnetic storage devices, optical storage devices, MEMs, nanotechnology-based storage devices, and the like.

In alternative implementations, computer system 800 may be implemented as hardware logic/electrical circuitry or firmware. In accordance with further embodiments, one or more of these components may be implemented in a system-on-chip (SoC). The SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

V. Additional Exemplary Embodiments

A method that is performed by data center management software executing on at least one computer is described herein. In accordance with the method, each of a plurality of fans used to dissipate heat generated by one or more servers in a data center is monitored to obtain data that indicates how an actual speed of each of the fans relates to a target speed of each of the fans. The obtained data is then compared to reference data that indicates, for each of the plurality of fans, how an actual speed of the fan relates to a target speed of the fan in a substantially pressure-neutral environment. Based on the comparison, it is determined that a pressure anomaly exists in the data center. Based on the determination that the pressure anomaly exists in the data center, one or more of the following is performed: generating an alert and modifying a manner of operation of one or more of at least one of the fans and at least one of the servers.

In an embodiment of the foregoing method, the plurality of fans comprise one or more of a server fan and a blade chassis fan.

In another embodiment of the foregoing method, each of the plurality of fans is configured to blow air into a hot aisle containment unit.

In yet another embodiment of the foregoing method, modifying the manner of operation of at least one of the fans comprises reducing a speed of at least one of the fans. In further accordance with such an embodiment, the method may further include monitoring a temperature of one or more internal components of one or more of the servers responsive to reducing the speed of the at least one of the fans.

In still another embodiment of the foregoing method, modifying the manner of operation of at least one of the servers comprises migrating a customer workflow from at least one of the servers.

In a further embodiment of the foregoing method, modifying the manner of operation of at least one of the servers comprises shutting down at least one of the servers.

In a still further embodiment of the foregoing method, modifying the manner of operation of at least one of the servers comprises reducing an amount of power supplied to one or more internal components of one or more of the servers.

In an additional embodiment of the foregoing method, comparing the obtained data to the reference data comprises determining, for each of the fans, a measure of difference between an actual-to-target speed relationship specified by the obtained data and an actual-to-target speed relationship specified by the reference data. In further accordance with such an embodiment, determining that the pressure anomaly exists in the data center based on the comparison may comprise determining that the measure of difference for a particular number of the fans exceeds a particular threshold.

A system is also described herein. The system includes at least one processor and a memory. The memory stores computer program logic for execution by the at least one processor. The computer program logic includes one or more components configured to perform operations when executed by the at least one processor. The one or more components include a fan monitoring component, a pressure anomaly detection component and a pressure anomaly response component. The fan monitoring component is operable to monitor each of a plurality of fans used to dissipate heat generated by one or more servers in a data center to obtain data that indicates how an actual speed of each of the fans relates to a target speed of each of the fans. The pressure anomaly detection component is operable to compare the obtained data to reference data that indicates, for each of the plurality of fans, how an actual speed of the fan relates to a target speed of the fan in a substantially pressure-neutral environment and, based on the comparison, determine that a pressure anomaly exists in the data center. The pressure anomaly response component is operable to perform one or more of the following in response to a determination that the pressure anomaly exists: (i) generate an alert and (ii) modify a manner of operation of one or more of at least one of the fans and at least one of the servers.

In an embodiment of the foregoing system, the pressure anomaly response component is operable to modify the manner of operation of at least one of the fans by reducing a speed of at least one of the fans. In further accordance with such an embodiment, the pressure anomaly response component may be further operable to monitor a temperature of one or more internal components of one or more of the servers responsive to reducing the speed of the at least one of the fans.

In another embodiment of the foregoing system, the pressure anomaly response component is operable to modify the manner of operation of at least one of the servers by migrating at least one service or resource from at least one of the servers.

In yet another embodiment of the foregoing system, the pressure anomaly response component is operable to modify the manner of operation of at least one of the servers by shutting down at least one of the servers.

In still another embodiment of the foregoing system, the pressure anomaly response component is operable to modify the manner of operation of at least one of the servers by reducing an amount of power supplied to one or more internal components of one or more of the servers.

In a further embodiment of the foregoing system, the pressure anomaly detection component is operable to compare the obtained data to the reference data by determining, for each of the fans, a measure of difference between an actual-to-target speed relationship specified by the obtained data and an actual-to-target speed relationship specified by the reference data. In further accordance with such an embodiment, the pressure anomaly detection component may be operable to determine that the pressure anomaly exists in the data center based on the comparison by determining that the measure of difference for a particular number of the fans exceeds a particular threshold.

A computer program product is also described herein. The computer program product comprises a computer-readable memory having computer program logic recorded thereon that when executed by at least one processor causes the at least one processor to perform a method that includes: monitoring each of a plurality of fans used to dissipate heat generated by one or more servers in a data center to obtain data that indicates how an actual speed of each of the fans relates to a target speed of each of the fans; determining that a pressure anomaly exists in the data center based on at least the obtained data; and based on the determination that the pressure anomaly exists in the data center, performing one or more of: generating an alert; and modifying a manner of operation of one or more of: at least one of the fans; and at least one of the servers.

In one embodiment of the foregoing computer program product, determining that the pressure anomaly exists in the data center based on at least the obtained data comprises comparing the obtained data to reference data that indicates, for each of the plurality of fans, how an actual speed of the fan relates to a target speed of the fan in a substantially pressure-neutral environment.

VI. Conclusion

While various embodiments have been described above, it should be understood that they have been presented by way of example only, and not limitation. It will be apparent to persons skilled in the relevant art(s) that various changes in form and details can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method performed by data center management software executing on at least one computer, comprising:
monitoring each of a plurality of fans used to dissipate heat generated by one or more servers in a data center to obtain data that indicates how an actual rotational speed of each of the fans as determined by a fan speed sensor relates to a target rotational speed of each of the fans;
comparing the obtained data to reference data that indicates, for each of the plurality of fans, how an actual rotational speed of the fan relates to a target rotational speed of the fan in a substantially pressure-neutral environment;
based on the comparison, determining that a pressure anomaly exists in the data center; and
based on the determination that the pressure anomaly exists in the data center,
modifying a manner of operation of one or more of:
at least one of the fans; and
at least one of the servers.

2. The method of claim 1, wherein the plurality of fans comprise one or more of:
a server fan; and
a blade chassis fan.

3. The method of claim 1, wherein each of the plurality of fans is configured to blow air into a hot aisle containment unit.

4. The method of claim 1, wherein modifying the manner of operation of at least one of the fans comprises:
reducing a speed of at least one of the fans.

5. The method of claim 4, further comprising:
monitoring a temperature of one or more internal components of one or more of the servers responsive to reducing the speed of the at least one of the fans.

6. The method of claim 1, wherein modifying the manner of operation of at least one of the servers comprises:
migrating a customer workflow from at least one of the servers.

7. The method of claim 1, wherein modifying the manner of operation of at least one of the servers comprises:
shutting down at least one of the servers.

8. The method of claim 1, wherein modifying the manner of operation of at least one of the servers comprises:
reducing an amount of power supplied to one or more internal components of one or more of the servers.

9. The method of claim 1, wherein comparing the obtained data to the reference data comprises determining, for each of the fans, a measure of difference between an actual-to-target speed relationship specified by the obtained data and an actual-to-target speed relationship specified by the reference data.

10. The method of claim 9, wherein determining that the pressure anomaly exists in the data center based on the comparison comprises:
determining that the measure of difference for a particular number of the fans exceeds a particular threshold.

11. A system comprising:
at least one processor; and
a memory that stores computer program logic for execution by the at least one processor, the computer program logic including one or more components configured to perform operations when executed by the at least one processor, the one or more components including:
a fan monitoring component that is operable to monitor each of a plurality of fans used to dissipate heat generated by one or more servers in a data center to obtain data that indicates how an actual rotational speed of each of the fans as determined by a fan speed sensor relates to a target rotational speed of each of the fans;
a pressure anomaly detection component that is operable to compare the obtained data to reference data that indicates, for each of the plurality of fans, how an actual rotational speed of the fan relates to a target rotational speed of the fan in a substantially pressure-neutral environment and, based on the comparison, determine that a pressure anomaly exists in the data center; and
a pressure anomaly response component that is operable to, in response to a determination that the pressure anomaly exists, modify a manner of operation of one or more of at least one of the fans and at least one of the servers.

12. The system of claim 11, wherein the pressure anomaly response component is operable to modify the manner of operation of at least one of the fans by reducing a speed of at least one of the fans.

13. The system of claim 12, wherein the pressure anomaly response component is further operable to monitor a temperature of one or more internal components of one or more of the servers responsive to reducing the speed of the at least one of the fans.

14. The system of claim 11, wherein the pressure anomaly response component is operable to modify the manner of operation of at least one of the servers by migrating a customer workflow from at least one of the servers.

15. The system of claim 11, wherein the pressure anomaly response component is operable to modify the manner of operation of at least one of the servers by shutting down at least one of the servers.

16. The system of claim 11, wherein the pressure anomaly response component is operable to modify the manner of operation of at least one of the servers by reducing an amount of power supplied to one or more internal components of one or more of the servers.

17. The system of claim 11, wherein the pressure anomaly detection component is operable to compare the obtained data to the reference data by determining, for each of the fans, a measure of difference between an actual-to-target speed relationship specified by the obtained data and an actual-to-target speed relationship specified by the reference data.

18. The system of claim 17, wherein the pressure anomaly detection component is operable to determine that the pressure anomaly exists in the data center based on the comparison by determining that the measure of difference for a particular number of the fans exceeds a particular threshold.

19. A computer program product comprising a computer-readable memory having computer program logic recorded thereon that when executed by at least one processor causes the at least one processor to perform a method comprising:
monitoring each of a plurality of fans used to dissipate heat generated by one or more servers in a data center to obtain data that indicates how an actual rotational speed of each of the fans as determined by a fan speed sensor relates to a target rotational speed of each of the fans;
comparing the obtained data to reference data that indicates, for each of the plurality of fans, how an actual rotational speed of the fan relates to a target rotational speed of the fan in a substantially pressure-neutral environment;
determining that a pressure anomaly exists in the data center based on at least the comparison; and
based on the determination that the pressure anomaly exists in the data center,
modifying a manner of operation of one or more of:
at least one of the fans; and
at least one of the servers.

20. The computer program product of claim 19, wherein comparing the obtained data to the reference data comprises determining, for each of the fans, a measure of difference between an actual-to-target speed relationship specified by the obtained data and an actual-to-target speed relationship specified by the reference data.

\* \* \* \* \*